United States Patent [19]

Takeshita et al.

[11] Patent Number: 5,014,239

[45] Date of Patent: May 7, 1991

[54] MAGNETIC BUBBLE GENERATOR USING PLURAL CONDUCTORS WITH COMMON CURRENT SOURCE

[75] Inventors: Masatoshi Takeshita, Hachiouji; Toshihiro Sato, Kokubunji; Takashi Toyooka, Sayama; Ryo Suzuki, Hachiouji, all of Japan

[73] Assignee: Hitachi, Ltd., Tokyo, Japan

[21] Appl. No.: 308,081

[22] Filed: Feb. 9, 1989

[30] Foreign Application Priority Data

Feb. 24, 1988 [JP] Japan .................. 63-39388

[51] Int. Cl.$^5$ .............................................. G11C 19/08
[52] U.S. Cl. ....................................................... 365/11
[58] Field of Search ............................................ 365/11

[56] References Cited

FOREIGN PATENT DOCUMENTS 143485 8/1983 Japan ...................... 365/11

OTHER PUBLICATIONS

The Bell System Technical Journal, vol. 59, No. 2 (1980), pp. 229-257, by T. J. Nelson, et al.
IEEE, Trans. Magnetics, MAG-15, No. 6 (1979), pp. 1715-1717, by S. Matsuyama, et al.
IEEE, Trans. Magnetics, MAG-16 (1980), pp. 1389-1395, by Ryo Suzuki and Floyd B. Humphrey.

*Primary Examiner*—James W. Moffitt
*Attorney, Agent, or Firm*—Pennie & Edmonds

[57] ABSTRACT

In a magnetic bubble generator having an ion-implanted track (1), a conductor pattern is composed of hairpin conductor patterns (5, 6) of two layers with an insulating layer (12) interlaid, and a part of intersection of the fore end parts of the gaps of these hairpin conductor patterns (5,6) is positioned in the vicinity of a cusp (4) of the ion-implanted track (1). The hairpin conductors may be electrically connected to each other and may be supplied by a common source. Thereby an error to be caused by a generated bubble stretching so much as to be divided into a plurality of pieces can be prevented, and the bubble can be generated by a small current pulse, while the amplitude margin thereof is enlarged.

8 Claims, 3 Drawing Sheets

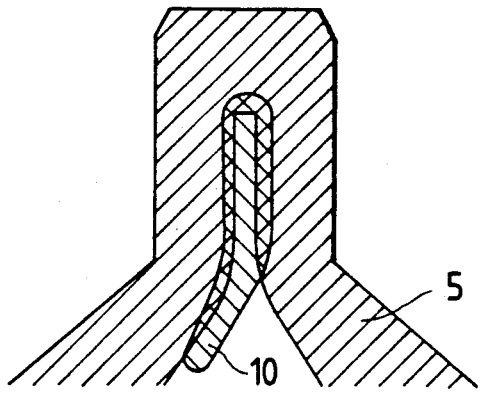
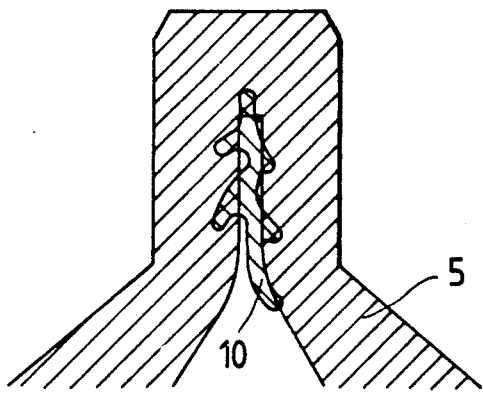
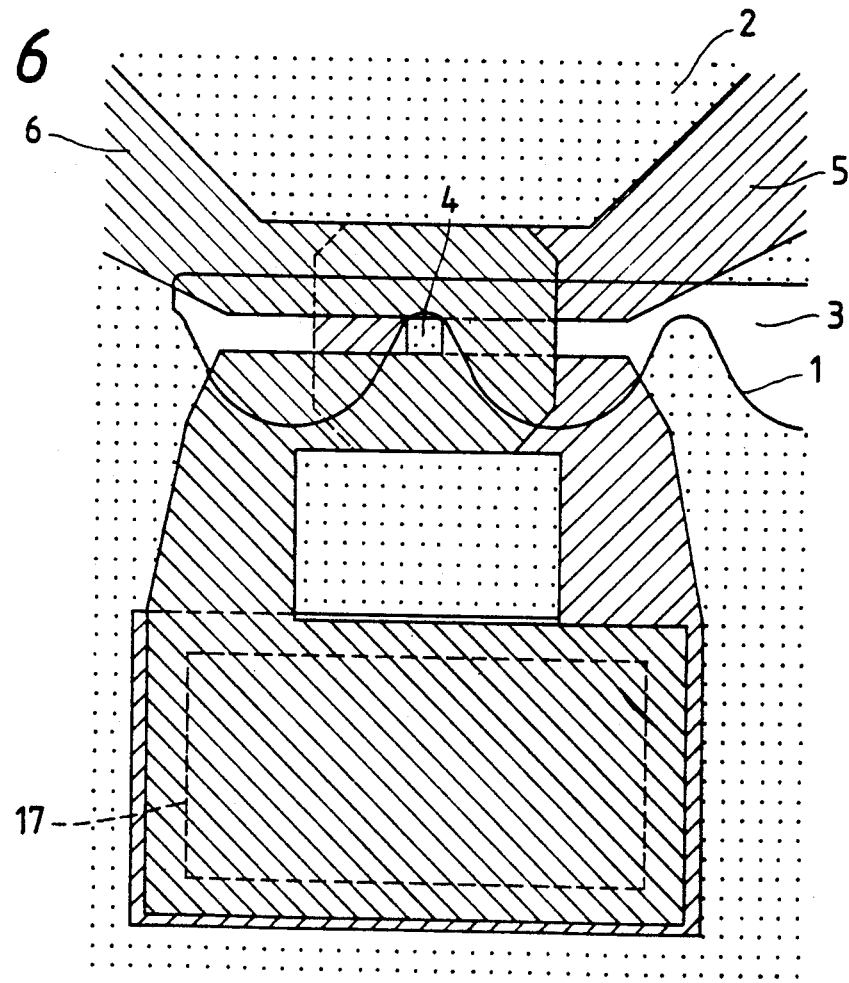

MAGNETIC BUBBLE GENERATOR USING PLURAL CONDUCTORS WITH COMMON CURRENT SOURCE

BACKGROUND OF THE INVENTION

The present invention relates to magnetic bubble memory devices using ion-implanted tracks, and particularly to an improvement in prevention of simultaneous generation of a plurality of bubbles in a generator using the ion-implanted track and a hairpin conductor pattern for a magnetic bubble memory chip.

As to a magnetic bubble generator composed of the ion-implanted track and the conductor pattern, a discussion is made, for instance, in The Bell System Technical Journal, Vol. 59, No. 2 (1980), pp. 229–257. As is shown in FIG. 2, an insulating layer omitted in the figure of $SiO_2$ or the like is superposed on an ion-implanted track 1, and a conductor pattern 5 of a hairpin type is put thereon. When the temperature of a chip having a bubble magnetic film, an insulating film and the conductor pattern (hereinafter simply called a chip) is 85° C., a current pulse with the amplitude of about 120 mA is made to flow through the hairpin conductor 5 to generate inside the hairpin gap 4 surrounded by said hairpin conductor 5, a magnetic field being reverse in direction to a bias magnetic field. A magnetic bubble is generated by inverting the magnetization of the bubble magnetic film locally by said magnetic field. The width of the current pulse required for generating the magnetic bubble is about 100 to 200 ns.

In FIG. 2, numeral 2 denotes an ion-implanted region, 3 a non-implanted region and 4 a cusp of the ion-implanted track 1. The generator using the ion-implanted track 1 and the hairpin conductor 5 according to the above-described prior art has a problem that two or more bubbles are generated simultaneously. When the current pulse is supplied through the hairpin conductor 5 shown in FIG. 2, a magnetic domain wherein magnetization is inverted is nucleated and said magnetic domain is stretched along the inside of the hairpin conductor 5. When the current pulse falls, the stretched magnetic domain begins to shrink and returns to a circular magnetic domain within several hundreds of nanoseconds. A part of said stretched magnetic domain is occasionally separated, in said bubble stretch and shrink operation, into two or more magnetic bubbles. The same phenomemon is observed in a generator composed of a Permalloy (Ni-Fe system high permeability alloy) track with a conductor pattern, and in this relation, it is described in IEEE, Trans. Magnetics, MAG-15, No. 6 (1979), pp. 1715–1717. The said erroneous operation of the generator using Permalloy tracks can be prevented by using a current pulse with a fall time of 100 to 400 ns. This method is effective for a magnetic bubble having a diameter of 1.5 µm, but it is not sufficiently effective when a magnetic bubble has a diameter smaller than 1 µm.

The factors relating to erroneous bubble generation, for diameters as large as 2 µm, are described in IEEE, Trans. Magnetics, MAG-16 (198), pp. 1389–1395. According to the description, a magnetic domain 10 stretches as shown in FIG. 5A immediately after the bubble is generated. A part of the domain stretching over the outside of a gap part of a hairpin conductor 5 is separated to cause the generation of an extra bubble. For a counter-measure, one effective method has been to prolong the shrinking time by making the fall time of the current pulse longer.

However, the result of studies by the present inventors has recently discovered that only making the fall time longer cannot prevent said erroneous generator operation for a generator with conductor pattern width of 3 to 4 µm and gap width of 1 µm when the bubble diameter is smaller than 1 µm. This is due to the reason discussed hereinbelow. In the case when the bubble diameter is small, the bubble generated in the gap of the hairpin conductor stretches not only in the direction of the hairpin, but also in the perpendicular direction. The stretched domain form is as shown in FIG. 5B. Consequently, the wave-shaped magnetic domain wall (boundary of the magnetic domain 10) is formed just after the bubble is generated by the current pulse supply. The error that the magnetic domain 10 is divided into two or more easily occurs after the current pulse falls and said error cannot be prevented, accordingly, even by making the fall time of a pulse current as long as 100 to 400 ns. In other words, such wave-shaped magnetic domain wall as mentioned above is formed and two or more bubbles are generated when the current pulse is supplied through the hairpin conductor, if a region wherein a magnetic pulse being reversed in direction to a bias field is generated has a width three times larger than the bubble diameter.

According to the studies of the present inventors, said problem can be solved by making the pattern width of the hairpin conductor and the width of the gap smaller proportional to the diameter of the bubble. In other words, it can be solved by narrowing the width of the region wherein the magnetic pulse is impressed. However, when the pattern width of the conductor is smaller, the conductor pattern migration due to the large current density results in an insufficient lifetime of the conductor pattern. It is also difficult to delineate the hairpin conductor pattern with the small width and the small gap.

SUMMARY OF THE INVENTION

An object of the present invention is to furnish a magnetic bubble generator which is free from the error of two or more bubbles being generated simultaneously, and particularly to furnish a magnetic bubble generator which is free from the said error even if the width of a hairpin conductor pattern and that of a gap thereof are not made small in the magnetic bubble generator using the ion-implanted track and the hairpin conductor pattern.

The above-mentioned object is attained by composing a magnetic bubble generator which comprises an ion-implanted track and two conductor patterns superposed and insulated from each other, wherein these two conductor patterns are of a hairpin type and include their respective gaps whose fore ends are in the vicinity of a cusp of the ion-implanted track (the fore end of the gap is disposed within 0.5G to 3G from the cusp when the width of the gap is G).

A first conductor pattern is provided on a bubble magnetic film with a first insulating film overlaid, a second insulating film is provided on said first conductor pattern, and further a second conductor pattern is formed thereon.

The said first and second insulating films are formed of films of $SiO_2$, $Al_2O_3$, polyimide resin or the like to be 0.05 to 0.4 µm and 0.1 to 0.5 µm thick respectively. If their thicknesses are outside of these limits, the operation of the bubble generator becomes unstable, which is not desirable.

As for the above-mentioned first and second hairpin conductor patterns, the fore ends of the respective gaps are disposed in the vicinity of the cusp of the track and the patterns intersect each other near the fore end parts of the gaps. An angle $\theta$ formed by the direction of the gap of the first conductor pattern and that of the gap of the second conductor pattern is set at 60° to 180° generally (the angle $\theta$ is 0° when the two hairpin conductor patterns having the same shape are fully overlapped each other). If the angle is smaller than 60°, the length of the overlapping part of the gaps tends to be too large, which results in too wide of an overlapping area of gaps and the effective confinement of the area with large field pulse region is not realized. Since the fore ends of the two gaps are located in the vicinity of the cusp of the track, the part of intersection wherein the gaps overlap each other is also located in the vicinity of the cusp. In the present specification, the statement that "the overlapping part of the gaps of the conductor patterns is located in the vicinity of the cusp of the track" means that the cusp is located inside the overlapping part of the gaps or that the distance between said cusp and the overlapping part of the gaps is 0.5G to 2G, where G denotes the width of the gap of the hairpin conductor pattern.

In the present invention, the shape of a pattern of the ion-implanted track, the material and the shape of the hairpin couductor, the material and the thickness of the bubble magnetic film, the kind of an implanted ion, etc. may be based on knowledges which have been known heretofore in this field of technique.

As described above, the division of a stretched magnetic domain can be prevented also by the prior art when the diameter of the bubble is 1.5 $\mu$m or above. Therefore, the application of the present invention is useful for the memory chip using a magnetic bubble of which diameter is smaller than 1.5 $\mu$m.

Next, a description will be made on the operation of the magnetic bubble generator of the present invention having the above-mentioned structure.

A current pulse having a current amplitude of about 80 mA and a pulse width of 100 to 200 ns is supplied through said hairpin conductor patterns in two level conductor layers, the upper and the lower. The magnetic pulse directions generated by the hairpin conductor pattern in upper layer and by the hairpin conductor pattern in lower layer are the same in the gap area where the two conductor patterns are intersected. Therefore, the magnetic field pulse amplitude generated by the two hairpin conductor patterns is almost twice as large as the magnetic field pulse amplitude generated by one of the hairpin conductor pattern. Therefore the amplitude of a pulse current necessary to flow through each hairpin conductor pattern can be decreased. Besides, the magnetic pulse generated by the current pulse in the gap part of the hairpin conductor pattern takes a reverse direction to that generated by the current pulse outside said pattern. Around the position whereat the gaps of the two hairpin conductor patterns intersect each other, accordingly, the amplitude of the magnetic pulse generated when the current pulse is suppled is lower than that of the magnetic pulse in the intersecting part of the gaps. In consequence, the position whereat the bubble is generated is limited to the position of intersection of the gaps. Moreover, a region wherein the amplitude of the magnetic pulse is large is narrow in the positions around the generated bubble. Accordingly, the generated bubble can be prevented from stretching, and thus the error that the stretched bubble is divided into two or more when the bubble shrinks from the state of stretch can be prevented.

BRIEF DESCRIPTION OF THE DRAWINGS

FIGS. 5A and 5B are the drawings showing the states of stretch of bubbles in the prior-art magnetic bubble generator respectively; and FIG. 6 is a schematic illustration of the top side view of a magnetic bubble generator in still. another embodiment of the present invention.

DESCRIPTION OF THE PREFERRED EMBODIMENTS

Embodiment 1

Figure 1:
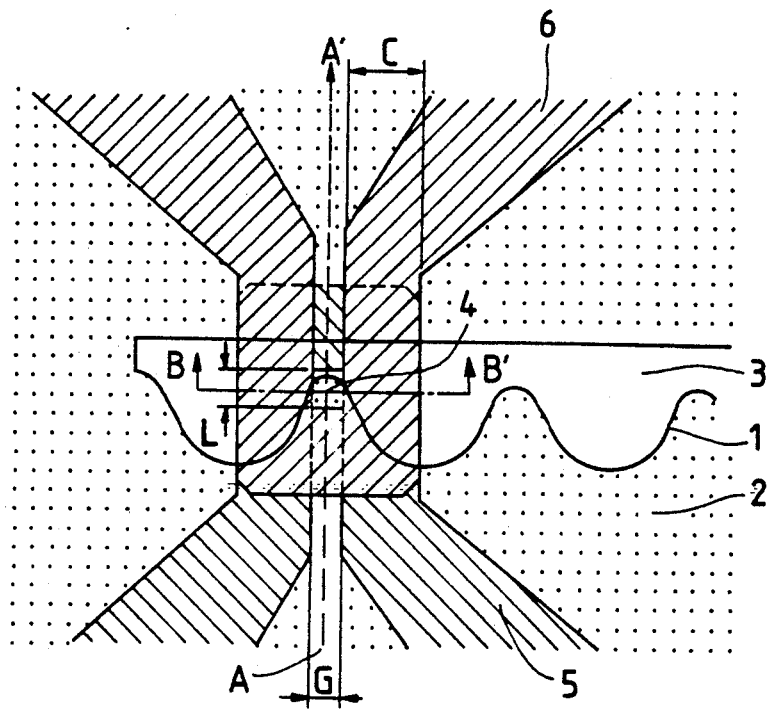
FIG. 1 is a schematic illustration of the top side view of a magnetic bubble generator in one embodiment of the present invention.
Figure 2:
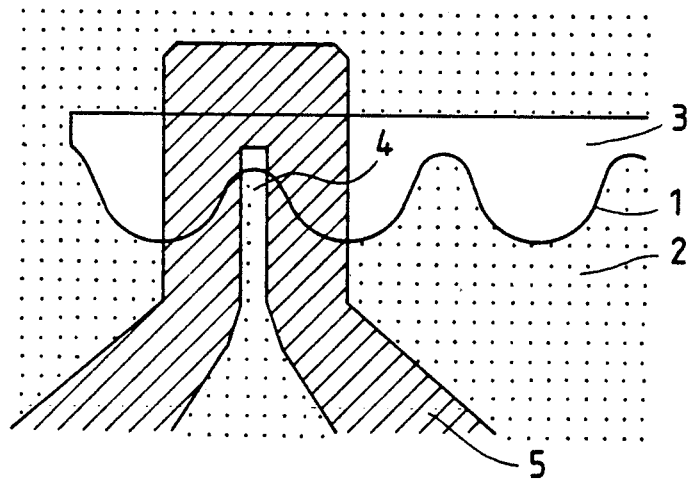
FIG. 2 is a schematic illustration of the top side view of a prior-art magnetic bubble generator.
Figure 4A:
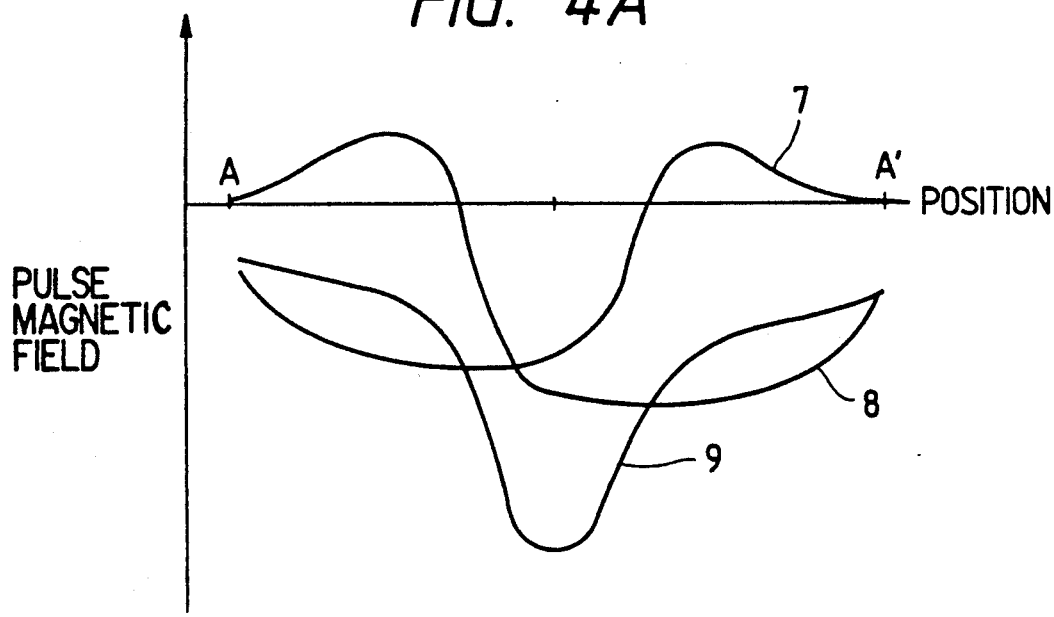
FIG. 4A is a graph showing the distributions of pulse magnetic fields of the magnetic bubble generator in one embodiment of the present invention.
Figure 4B:
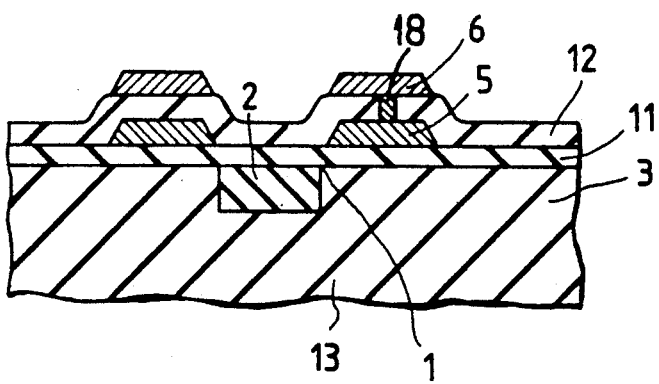
FIG. 4B is a schematic sectional view of the magnetic bubble generator in one embodiment of the present invention.

A first embodiment of the present invention will be described hereunder according to FIGS. 1 and 4B. In the figures, an ion-implanted track 1 is formed on the boundary between an implanted region 2 where ions of hydrogen or the like are implanted and a non-implanted region 3 in a bubble magnetic film 13 of magnetic garnet or the like. In the vicinity of a cusp 4 of the ion-implanted track 1, there are provided a first-layer hairpin conductor pattern 5 formed of an Au/Mo double-layer film and having the fore end of the gap thereof, and a second-layer hairpin conductor pattern 6 formed of the Au/Mo double-layer film and having the fore end of the gap thereof. FIG. 4B shows a cross section taken along a line B—B' of FIG. 1. The Au/Mo double-layer film includes a 0.33 $\mu$m thick Au film on the lower side (on the bubble magnetic film side) and a 0.02 $\mu$m thick Mo film on the upper side. The width C of the hairpin conductor patterns 5 and 6 is set to be 3 $\mu$m, the gap width G thereof 1 $\mu$m, and the thickness thereof 0.35 $\mu$m. While the length L of the overlapping part (the intersecting part) of the two gaps is set at G generally, it is only required to be in the range of $0 < L \leq 3G$. The length L of the gap is set at 1.25G in the present embodiment. The width C of the hairpin conductor patterns, the gap width G and the thickness thereof are set, in general, to be 2.5 to 4.5 $\mu$m, 0.7 to 1.5 $\mu$m and 0.25 to 0.7 $\mu$m respectively in the same way as usual, but values outside of these ranges may be used if they are necessary in designing.

An angle $\theta$ formed by the direction of the gap of the hairpin pattern 5 and the direction of the gap of the hairpin pattern 6 is set at essentially 180°. Between the first-layer hairpin conductor pattern 5 and the bubble magnetic film 13, a first insulating layer 11 having a thickness of 0.05 to 0.4 $\mu$m and formed of SiO$_2$ or the like is interdisposed. A second insulating layer 12 formed of SiO$_2$ or the like and having a thickness of 0.1 to 0.5 μm is disposed on the first-layer conductor 5. Furthermore, a second-layer hairpin conductor pattern 6 is formed thereon. A part wherein the gap of the first-layer hairpin conductor pattern 5 and that of the second-layer hairpin conductor pattern 6 overlap each other is disposed in the vicinity of the cusp 4 of the ion-implanted track. The left-side part of the hairpin conductor pattern 5 and that of the hairpin conductor pattern 6 in FIG. 1 are connected to each other by a through hole, an example 18 of which is shown on FIG. 4B. In said structure, the amplitude of a magnetic pulse generated on a line A—A' of FIG. 1 when a current pulse is supplied from the right side of the hairpin conductor pattern 6 onto the right side of the hairpin conductor pattern 5 turns to be as shown in FIG. 4A. The amplitude of the magnetic pulse generated by the hairpin conductor pattern 5 forms a curve 8 of FIG. 4A, and the amplitude of the magnetic pulse generated by the hairpin conductor pattern 6 forms a curve 7 of FIG. 4A, while the composite of the magnetic fields generated by the two hairpin conductor patterns forms a curve 9. When the hairpin conductor patterns of two layers are used, the amplitude of the magnetic pulse generated by the supplied current pulse is larger than that generated by the same pulse when the hairpin conductor pattern of one layer is used (the pulse magnetic field generated in these cases is assumed to have a negative value in the gap). Therefore a bubble can be generated by a small current pulse (80 mA in the present embodiment when a chip temperature is 85° C.). Also, the bubble is generated at a position whereat the absolute value of the magnetic pulse is the maximum. The bubble thus generated stretches to a region wherein the amplitude of the magnetic field pulse is about 60 to 70% of the amplitude of the magnetic pulse required for the generation of the bubble. When a single-layer hairpin conductor pattern is used, a bubble may stretch across a hairpin part. On the other hand, with the two-layer hairpin conductor pattern, such a stretch is limited to the vicinity of the overlapping part of the gaps of the hairpin conductor patterns. The stretch length of the domain can be made so small as 1/5 to 1/10. Consequently, it is possible to prevent the error caused by the stretched bubble being divided and thus generating two or more bubbles are thus generated simultaneously when the bubble shrinks.

Embodiment 2

Figure 3:
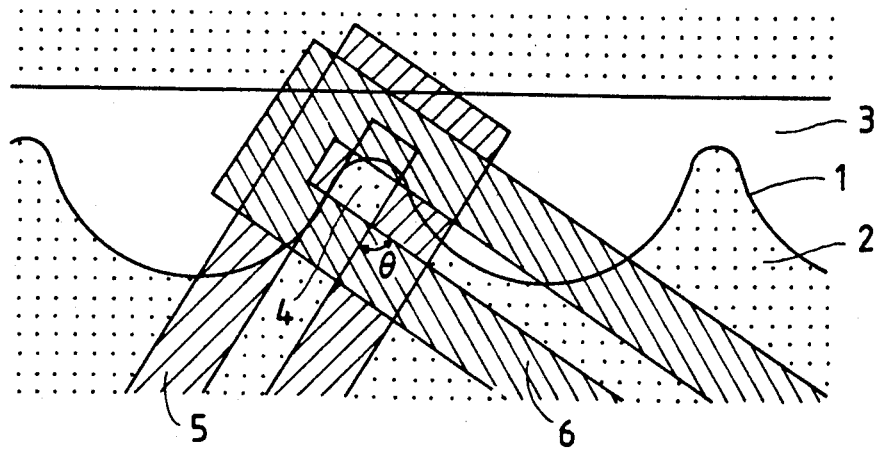
FIG. 3 is a schematic illustration of the top side view of a magnetic bubble generator in another embodiment of the present invention.

A second embodiment of the present invention will be described hereunder by using FIG. 3. In the present embodiment, a first-layer hairpin conductor pattern 5 and a second-layer hairpin conductor pattern 6 which have the fore ends of the respective gaps in the vicinity of a cusp 4 of an ion-implanted track 1 are disposed in the same way as in the embodiment 1. Moreover, the first-layer hairpin conductor pattern 5 and the second-layer hairpin conductor pattern 6, and also a bubble magnetic film, a first insulating layer and a second insulating layer, are in the same relationships as in the embodiment 1. It is in the positional relationship between the two hairpin conductor patterns 5 and 6 that the present embodiment differs from the embodiment 1. In the present embodiment, the value of the angle θ formed by the gaps of the hairpin conductor patterns is set in a range of 60 to 120°, while said angle is set at 180° in the embodiment 1. Moreover, the directions of the gaps of the hairpin conductor patterns 5 and 6 are set substantially along the boundary of an ion-implanted region 2 and a non-implanted region 3 of the ion-implanted track which is disposed close to the gaps. In the present embodiment, the effect of narrowing a region wherein the magnetic pulses generated by the hairpin conductor patterns are intense is the same as in the first embodiment.

As a result, the form of the magnetic domain wall of the stretched domain is not wave-like even in the shrinkage process due to magnetic field generated by the magnetic poles at the edge of the ion-implanted region.

Embodiment 3

A third embodiment of the present invention will be described hereunder by using FIG. 6. In the present embodiment, a first-layer hairpin conductor pattern 5 and a second-layer hairpin conductor pattern 6 having the fore ends of the respective gaps in the vicinity of a cusp 4 of an ion-implanted track 1 are disposed in the same way as in the embodiment 1. Moreover, the first-layer hairpin conductor pattern 5 and the second-layer hairpin conductor pattern 6, and also a bubble magnetic film, a first insulating layer and a second insulating layer, have the same relationship as in the embodiment 1. It is in the positional relationship between the two hairpin conductor patterns and the ion-implanted track 1 that the present embodiment differs from the embodiment 1. In the present embodiment, an angle formed by the longitudinal directions of the gaps of the two hairpin conductor patterns and the ion-implanted track 1 in the cusp part is about 0°, while it is about 90° in the embodiment 1. A through hole 17 is provided in the second insulating layer so as to couple electrically the first-layer hairpin conductor pattern 5 and the second-layer hairpin conductor pattern 6 together. In the bubble generator having such a structure as described above, the gap position of the hairpin conductor patterns is blocked up by the boundary of the ion-implanted track in the cusp 4. Numerals 2 and 3 denote an ion-implanted region and a non-implanted region respectively in FIG. 6. Since a potential barrier obstructing the stretch of a bubble is present on the boundary of the ion-implanted track, the barrier is superposed on the distribution of the magnetic field represented the curve 9 in FIG. 4A, and therefore the stretch of a generated magnetic bubble can be limited to a still narrower part. In the embodiment 1, the magnetic domain stretches to the extent of two or three times as long as the diameter of the bubble in one direction (in the downward direction of FIG. 1) of the directions of the gaps. As the result, the error of the bubble being divided in two occurs when the amplitude of a current is increased. In contrast, the generator of the present embodiment has a large effect on reducing the stretch length of the generated bubble, and therefore increases the current amplitude margin larger by about 30% over that of the embodiment 1. Herein the current amplitude margin represents the difference between the maximum and minimum amplitudes of a current pulse with which the bubble generator can operate in a stable manner. The current amplitude margin in the case of the embodiment 1 is about 54 mA.

As is apparent from the foregoing description, the stretch length of a generated bubble can be made small sufficiently, according to the present invention, by employing the bubble generator wherein the ion-implanted track and the hairpin conductor patterns of two layers are used. As a result, the error that the generated bubble stretches so much as to be divided in two can be prevented, even in the case when the diameter of the bubble is smaller than 1.5 μm. Furthermore, when a chip temperature is 85° C., in addition, the amplitude margin of a generator current pulse can be enlarged to be 70 mA in relation to 80 mA to 150; this margin is three times or more larger than the amplitude margin of 20 mA in relation to 120 mA to 140 mA in the prior-art generator wherein the hairpin conductor pattern of one layer is used. Also, it is a matter of course that a magnetic bubble chip having the present bubble generator has the same effect as mentioned above.

What is claimed is:

1. A magnetic bubble generator comprising an ion-implanted track and two conductor patterns superposed and insulated from each other by an insulating means, wherein said two conductor patterns are of a hairpin type and include their respective gaps whose fore ends are disposed in the vicinity of a cusp of the ion-implanted track and wherein said two conductor patterns of a hairpin type are electrically connected to each other by a conducting through hole formed in said insulating means and to a single current pulse supply.

2. A magnetic bubble generator comprising a bubble magnetic film with an ion-implanted track, wherein a first insulating layer, first hairpin conductor pattern, a second insulating layer and a second hairpin conductor pattern are provided sequentially on the bubble magnetic film, said first and second hairpin conductor patterns are electronically connected to each other via a conducting through hole formed in said second layer and to a single current pulse supply, and their respective gaps whose fore ends intersect in the vicinity of a cusp of said ion-implanted track so that a gap intersection part is formed in the vicinity of said cusp.

3. A magnetic bubble generator according to claim 2, wherein an angle $\theta$ formed by the longitudinal direction of the gap of said first hairpin conductor pattern and the longitudinal direction of the gap of said second hairpin conductor pattern is about 180°.

4. A magnetic bubble generator according to claim 3, wherein an angle formed by the longitudinal directions of the gaps of said hairpin conductor patterns and the ion-implanted track (1) in the part of said cusp (4) is about 90°.

5. A magnetic bubble generator according to claim 2, wherein an angle $\theta$ formed by the longitudinal direction of the gap of said first hairpin conductor pattern and the longitudinal direction of the gap of said second hairpin conductor pattern is 60° to 120°.

6. A magnetic bubble device comprising a magnetic bubble generator which includes an ion-implanted track and two conductor patterns laminated and insulated from each other by an insulating layer, wherein said two conductor patterns are of a hairpin type and include their respective gaps whose fore ends are disposed in the vicinity of the cusp of the implanted track and wherein said two conductor patterns of a hairpin type are electrically connected to each other by a conducting through hole formed in said insulating layer and to a single current pulse supply.

7. A magnetic bubble generator comprising a bubble magnetic film with an ion-implanted track, wherein a first insulating film layer, a first hairpin conductor pattern, a second insulating layer and a second hairpin conductor pattern are provided sequentially on the bubble magnetic film, said first and second hairpin conductor patterns having respective gaps whose for ends intersect in the vicinity of a cusp of said ion-implanted track so that a gap intersection is formed in the vicinity of said cusp, wherein an angle formed by the longitudinal direction of the gap of said first hairpin conductor pattern and the longitudinal direction of said second hairpin conductor is about 180° and an angle formed by the longitudinal directions of the gaps of said first conductor pattern and said ion-implanted track in the region of said cusp is about 0°.

8. A magnetic bubble device including a magnetic bubble generator which comprises a bubble magnetic film with an ion-implanted track, wherein a first insulating film layer, a first hairpin conductor pattern, a second insulating layer and a second hairpin conductor pattern are provided sequentially on the bubble magnetic film, said first and second hairpin conductor patterns having respective gaps whose for ends intersect in the vicinity of a cusp of said ion-implanted track so that a gap intersection is formed in the vicinity of said cusp, wherein an angle formed by the longitudinal direction of the gap of said first hairpin conductor pattern and the longitudinal direction of said second hairpin conductor is about 180 and angle formed by the longitudinal directions of the gaps of said first conductor pattern and said ion-implanted track in the region of said cusp is about $\theta$.

* * * * *